(12) United States Patent
Tarczynski

(10) Patent No.: US 8,987,873 B2
(45) Date of Patent: Mar. 24, 2015

(54) SUPER INTEGRATED CIRCUIT CHIP SEMICONDUCTOR DEVICE

(76) Inventor: Gregory Richard Tarczynski, Chicago, IL (US)

(*) Notice: Subject to any disclaimer, the term of this patent is extended or adjusted under 35 U.S.C. 154(b) by 0 days.

(21) Appl. No.: 12/879,386

(22) Filed: Sep. 10, 2010

(65) Prior Publication Data

US 2013/0168694 A1   Jul. 4, 2013

(51) Int. Cl.
| | |
|---|---|
| H01L 23/495 | (2006.01) |
| H01B 1/02 | (2006.01) |
| H01L 29/16 | (2006.01) |
| H01L 23/08 | (2006.01) |
| H01L 23/00 | (2006.01) |
| H01L 29/26 | (2006.01) |

(52) U.S. Cl.
CPC ............ *H01B 1/026* (2013.01); *H01L 29/1602* (2013.01); *H01L 23/08* (2013.01); *H01L 24/45* (2013.01); *H01L 29/26* (2013.01); *H01L 2224/45147* (2013.01); *H01L 2924/15787* (2013.01); *H01L 2924/01327* (2013.01); *H01L 2924/01015* (2013.01); *H01L 2924/01047* (2013.01); *H01L 2924/00014* (2013.01); *H01L 2924/01006* (2013.01)
USPC .......................................................... 257/666

(58) Field of Classification Search
None
See application file for complete search history.

(56) References Cited

U.S. PATENT DOCUMENTS

| | | | | |
|---|---|---|---|---|
| 5,330,611 | A | * | 7/1994 | Doll .............................. 117/105 |
| 5,532,513 | A | * | 7/1996 | Smith et al. .................... 257/703 |
| 5,895,938 | A | * | 4/1999 | Watanabe et al. ............... 257/77 |
| 5,960,262 | A | * | 9/1999 | Torres et al. .................. 438/123 |
| 6,700,199 | B2 | * | 3/2004 | Moon et al. .................... 257/741 |
| 2004/0262744 | A1 | * | 12/2004 | Dahl et al. ..................... 257/712 |
| 2007/0202349 | A1 | * | 8/2007 | Chen ............................. 428/607 |
| 2008/0061440 | A1 | * | 3/2008 | Uno et al. ...................... 257/762 |
| 2009/0188696 | A1 | * | 7/2009 | Uno et al. .................. 174/126.2 |
| 2009/0272466 | A1 | * | 11/2009 | Shindo et al. ................. 148/432 |

* cited by examiner

*Primary Examiner* — Benjamin Sandvik

(57) ABSTRACT

The CP555 Super Integrated Circuit Chip has a ceramic package casing made from (B4-C) Boron Carbide: a non-conducting ceramic material. The IC is connected to connector pins by microcircuits and a custom formulated bond wire. The CP555 Integrated Circuit's ceramic Boron Carbide (B4-C) outer package casing, Heterodiamond substrates and dielectric components allows these integrated circuits to reduce electro-migration to a minimum, produce superior radiation hardness, heat resistance, electromagnetic shielding, and resistance to damage from harsh elements and environments. The CP555 Integrated Circuit can be used as a CMOS, PIC or DIE microcontroller circuit or computer processor (CPU). FIG. 1, shows the integrated circuit package 50, the outer package casing 138 also in FIG. 1, top left. Together, the Heterodiamond (B—C—N) semiconductor substrate and dielectric components, combined with a (Cu—Au—Ag) custom formulated bond wire work synergistically to make The CP555 Super Integrated Circuit Chip a unique semiconductor device.

16 Claims, 1 Drawing Sheet

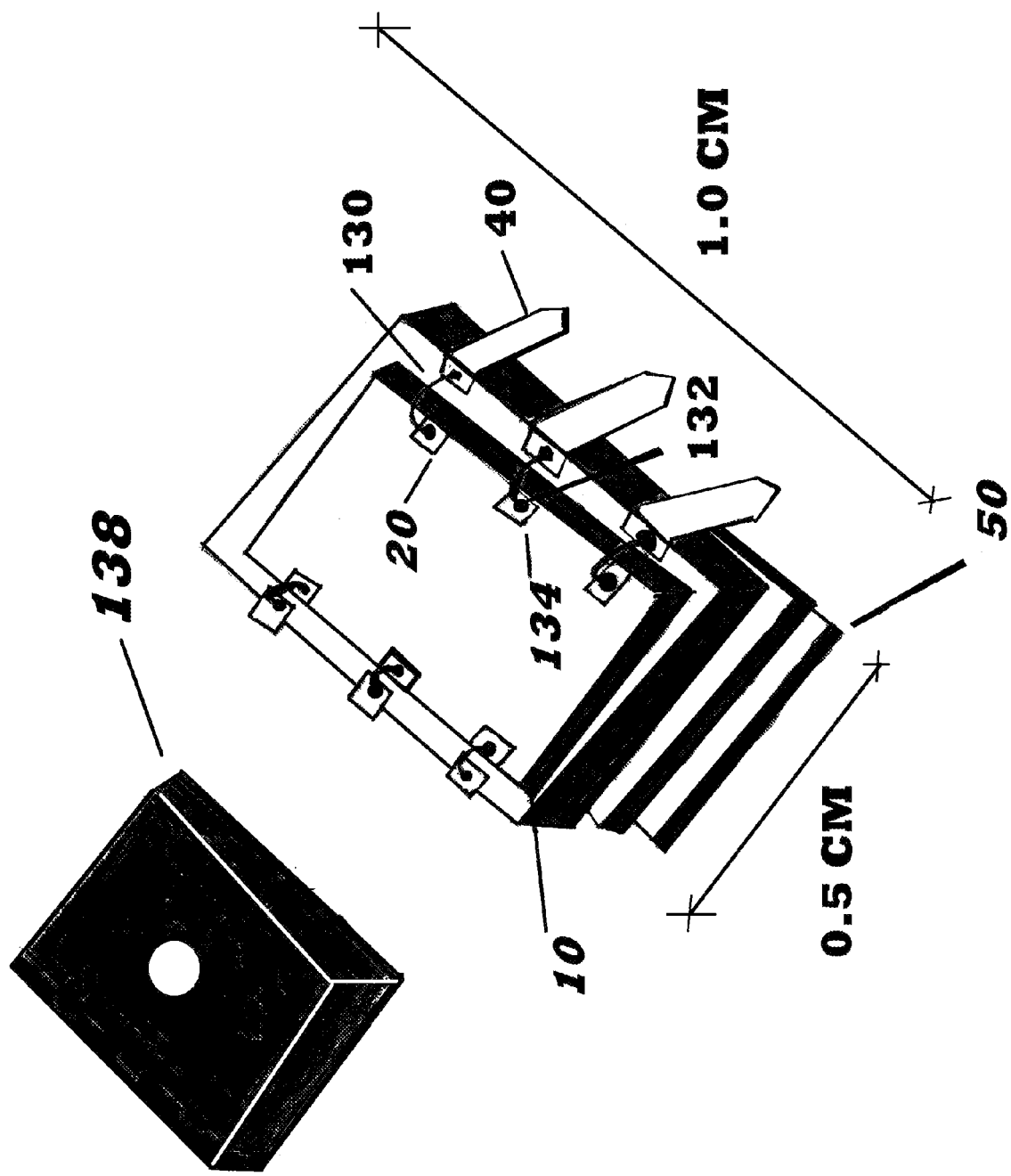

SUPER INTEGRATED CIRCUIT CHIP SEMICONDUCTOR DEVICE

BACKGROUND OF INVENTION

The CP555 Super Integrated Circuit Chip semiconductor device is similar to a common Integrated Circuit but, has a superior ceramic outer casing which, is made from Boron Carbide (B4-C) and houses a chip pad and multiple layers of Heterodiamond Substrates with bonding wire that contains: an Au—Cu—Ag alloy including 5-40% Ag by weight in Cu having a purity of 99.999% or greater; at least one element of a first group consisting of Pd, Rh, Pt, and Ir in an amount of about 50-10,000 ppm by weight; at least one element of a second group consisting of B, Be, and Ca in an amount of about 1-50 ppm by weight; at least one element of a third group consisting of P, Sb, and Bi in an amount of about 1-50 ppm by weight; and at least one element of a fourth group consisting of Mg, TI, Zn, and Sn in an amount of about 5-50 ppm by weight. The bonding wire is highly reliable with a strong tensile strength at room temperature and high temperature and favorable bond ability. When the bonding wire is looped, no rupture occurs in a ball neck region. Also, no chip cracking occurs since the ball is soft.

BRIEF DESCRIPTIONS OF DRAWINGS

Referring to FIG. 1, a general semiconductor package includes a semiconductor chip 10 on a pad 50, a plurality of chip pads 20 formed on the semiconductor chip 10 as input/output ports for a variety of signals, a plurality of lead frames 40 electrically connected to the semiconductor chip 10 to receive the variety of signals from or to output the same to an external circuit; and a bonding wire 30 for electrically connecting the chip pad 20 and the lead frame 40. This structure of the general semiconductor package is protected by, for example, the CP555 integrated circuit has a superior ceramic outer casing made from Boron Carbide and houses the chip pad and the Heterodiamond substrate layers. Also, one end of the bonding wire 30 bound to the chip pad 20 includes a compressed ball 32 and a neck 34 as a connector between the compressed ball 32 and the bonding wire 30. In a wire bonding process, one end of the bonding wire 30 is melted by discharging to form a free air ball of a predetermined size and pressed on the chip pad 20 to be bound to the chip pad 20. A loop of the bonding wire 30 having an appropriate height and length is formed to reach a corresponding lead frame 40, and the other end of the bonding wire 30 is bound to the lead frame 40 with an application of pressure. As a result, the semiconductor chip 10 and the lead frame 40 are electrically connected.

A Copper-Silver-Gold (Au—Cu—Ag) alloy is used for the bonding wire 30. Gold and Silver forms a complete solid solution together with Copper, so the alloy can be produced on a large scale, thereby lowering the manufacturing cost of the bonding wire. However, when a loop is formed with the conventional bonding wire 30, the bonding wire 30 often breaks near the neck, as indicated by reference numeral 35. A reduced loop height due to the increasing integration density of a semiconductor device further increases the breakage 35 of the neck 34. The breakage 35 occurs due to a poor tensile strength of the bonding wire 30. Accordingly, a signal transmission path formed by the loop is opened. In addition, the poor strength of the bonding wire 30 Causes a loop sagging or sweeping (indicated by reference numeral 36) in a molding process, so that adjacent loops contact one another. When a bonding wire formed as described above is looped, the loop shape is maintained without sagging due to the strong tensile strength, and the loop sweeping is reduced to lower the probability that a short circuit occurs due to electrical contact with adjacent loops, as described above. The ball shape is also favorable. The bonding wires 130 electrically connect a plurality of chip pads 20 on a semiconductor chip 10 mounted on a pad 20 and a plurality of lead frames 40. After being bound to the chip pad 20, the bonding wire 130 has a compressed ball 132 and a neck 134 connecting the boning wire 130 and the compressed ball 132. According to the present invention, the bonding wire 130 can be smoothly looped without a breakage of the neck 134. The loop shape is favorably maintained without sagging or sweeping. 50 The layers of Heterodiamond Substrate and circuits are the core to entire package which protected by 138 a ceramic Boron Carbide ceramic outer casing.

DETAILED DESCRIPTION OF INVENTION

This structure of this semiconductor package is protected by, the CP555 integrated circuit, a superior ceramic outer casing made from Boron Carbide and houses the chip pad and the Heterodiamond substrate layers. The general purpose for this came about because, of the current dilemma that occurs with CMOS Scaling and electromigration beyond 8 nm. As described above, the Cu—Au—Ag alloy bonding wire according to the present invention has a lot of synergy between the added elements. Also, the free air ball is softer than conventional one, so chip cracking nearly does not occur during a wire bonding process. Even when an ultra-low loop is formed with the bonding wire according to the present invention, almost no breakage occurs near the neck.

According to the present invention, ball grain refinements are suppressed to reduce the grain area, thereby reducing an atomic diffusion path between Au and Ag. Accordingly, intermetallic compound and Kirkendall void formation is suppressed, thereby improving thermal stability. The bonding wire according to the present invention has a strong tensile strength at room temperature and high temperature, and the loop shape after bonding is constantly maintained. In addition, the adhesion between the bonding wire and the chip pad is excellent and is maintained even after a high-temperature process for a long period of time. The ceramic outer casing made from Boron Carbide and its thermal resistance and protection from harsh elements and environments, the unique semiconductor qualities of the Heterodiamond substrate layers and the bonding wire according and to the present invention are favorable, and thus according to the present invention have wide industrial applications and numerous applications in many other fields, the forming of a new electrical interconnection in semiconductor packages. The present invention has been particularly shown and described with reference to preferred embodiments thereof. It will be understood by those of ordinary skill in the art that various changes in form and details may be made therein without departing from the spirit and scope of the present invention as defined by the appended claims.

The semiconductor device consists of a ceramic package containing boron carbide, a ceramic material which is obtained by decomposing $B_2O_3$ with carbon in an electric furnace, it's unique and exceptional qualities produce superior radiation hardness, heat resistance, electromagnetic shielding, and resistance to damage from harsh elements and environments.

Heterodiamond, symbol B—C—N, is used as a substrate material in the disclosed integrated circuits, this semiconductor substrate, because of its unique semiconductor electrical behavior, between that of a conductor and an insulator at room temperature. With the proper addition of dopant element (such as silicon and gallium), p-n junctions can be formed and can be useful in electronic components and integrated circuits that are built from p-n junctions; Heterodiamond is a super-hard compound of boron, carbon, and nitrogen.

A bonding wire can be included that contains: a Cu—Au—Ag alloy including 5-20% Ag and 5-20% Au—by weight in Cu having a purity of 99.999% or greater, also at least one element of a first group consisting of Pd, Rh, Pt, and Jr in an amount of about 50-10,000 ppm by weight; at least one element of a second group consisting of B, Be, and Ca in an amount of about 1-50 ppm by weight; at least one element of a third group consisting of P, Sb, and Bi in an amount of about 1-50 ppm by weight; and at least one element of a fourth group consisting of Mg, Ti, Zn, and Sn in an amount of about 5-50 ppm by weight.

The bonding wire can have as many elements as possible from each of the first through fourth groups to add for synergism.

The bonding wire can be essentially 15-30% Ag and Au by weight, along with Pd, Be, Ca, and Mg.

The bonding wire can contain 15-30% Ag and Au by weight, Pd and Pt each in an amount of about 500-1,500 ppm by weight; B, Be, and Ca each in an amount of about 1-30 ppm by weight; P, Sb, and Bi each in an amount of about 3-30 ppm by weight; and Mg and Zn each in an amount of 3-30 ppm by weight.

The bonding wire can contain 10-30% Ag and Au by weight; Pd in an amount of about 1,000-10,000 ppm by weight; Be and Ca each in an amount of about 5-20 ppm by weight; P and Bi each in an amount of about 5-20 ppm by weight; and Mg, Zn, and Sn each in an amount of about 5-20 ppm by weight.

The bonding wire can contain 10-30% Ag and Au by weight; Pd, Rh, Pt, and Ir each in an amount of about 100-10,000 ppm by weight; Be and Ca each in an amount of about 5-30 ppm by weight; Sb and Bi each in an amount of about 5-20 ppm by weight; and Mg and Sn each in an amount of about 5-30 ppm by weight.

The bonding wire can contain 10-30% Ag and Au by weight; Pd, Rh, and Pt each in an amount of about 100-10,000 ppm by weight; B, Be, and Ca each in an amount of about 2-30 ppm by weight; P and Bi each in an amount of about 5-20 ppm by weight; and Mg, Ti, Zn, and Sn each in an amount of about 3-30 ppm by weight.

The bonding wire can contain 10-30% Ag and Au by weight; Pd and Pt each in an amount of about 500-10,000 ppm by weight; B, Be, and Ca each in an amount of about 2-30 ppm by weight; Sb and Bi each in an amount of about 5-20 ppm by weight; and Mg, Ti, and Zn each in an amount of about 3-20 ppm by weight.

What is claimed is:

1. A semiconductor device comprising:
    an outer casing comprising boron carbide sized to house a single semiconductor chip;
    a pad;
    wherein the semiconductor chip is mounted to said pad;
    wherein the semiconductor chip comprises heterodiamond substrate layers having p-n junctions;
    wherein the semiconductor chip mounted to said pad has a plurality of chip pads-mounted to said semiconductor chip;
    a plurality of lead frames electronically connected to said semiconductor chip; and
    a plurality of bonding wires having a compressed ball structure on each end, said bond wires electronically connecting said lead frames to said chip pads.

2. The semiconductor device of claim 1, wherein said plurality of bonding wires is made of an alloy, said alloy comprising:
    a Cu—Au—Ag alloy including 5-20% Ag and 5-20% Au by weight in Cu.

3. The bonding wire of claim 2, wherein the bonding wire comprises: 10-15% Ag and 10-15% Au by weight in Cu.

4. The bonding wire of claim 2, wherein the bonding wire comprises: 10-20% Ag and 10-20% Au by weight in Cu.

5. The bonding wire of claim 2, wherein the bonding wire comprises: 5-10% Ag and 5-10% Au by weight in Cu.

6. The semiconductor device of claim 1 wherein the bonding wire comprises:
    a Cu—Au—Ag alloy including 5-20% Ag and 5-20% Au by weight in Cu; and
    at least one element of a first group consisting of Pd, Rh, Pt, and Ir in an amount of about 50-10,000 ppm by weight;
    at least one element of a second group consisting of B, Be, and Ca in an amount of about 1-50 ppm by weight;
    at least one element of a third group consisting of P, Sb, and Bi in an amount of about 1-50 ppm by weight; and
    at least one element of a fourth group consisting of Mg, Ti, Zn, and Sn in an amount of about 5-50 ppm by weight.

7. The bonding wire of claim 6, wherein the bonding wire comprises: 10-15% Ag and 10-15% Au by weight in Cu.

8. The bonding wire of claim 6, wherein the bonding wire comprises: 10-20% Ag and 10-20% Au by weight in Cu.

9. The bonding wire of claim 6, wherein the bonding wire comprises: 5-10% Ag and 5-10% Au by weight in Cu.

10. The bonding wire of claim 6, wherein the bonding wire comprises: 20% Ag and 20% Au by weight in Cu.

11. The bonding wire of claim 6, wherein the bonding wire comprises: 5-20% Ag and 20% Au by weight in Cu.

12. The bonding wire of claim 6, wherein the bonding wire comprises: 5-20% Ag and 10% Au by weight in Cu.

13. The bonding wire of claim 6, wherein the bonding wire comprises: 5-20% Ag and 5% Au by weight in Cu.

14. The bonding wire of claim 6, wherein the bonding wire comprises: 20% Ag and 5-20% Au by weight in Cu.

15. The bonding wire of claim 6, wherein the bonding wire comprises: 10% Ag and 5-20% Au by weight in Cu.

16. The bonding wire of claim 6, wherein the bonding wire comprises: 5% Ag and 5-20% Au by weight in Cu.

* * * * *